United States Patent
Hsiao et al.

(10) Patent No.: US 8,466,614 B2
(45) Date of Patent: Jun. 18, 2013

(54) FRONT LIGHT PLATE AND REFLECTIVE DISPLAY APPARATUS USING THE SAME

(75) Inventors: Po-Wen Hsiao, Hsinchi (TW);
Sung-Hui Huang, Hisnchu (TW);
Yi-Ching Wang, Hsinchu (TW);
Ted-Hong Shinn, Hsinchu (TW)

(73) Assignee: E Ink Holdings Inc., Hsinchu County (TW)

( * ) Notice: Subject to any disclaimer, the term of this patent is extended or adjusted under 35 U.S.C. 154(b) by 431 days.

(21) Appl. No.: 12/699,069

(22) Filed: Feb. 3, 2010

(65) Prior Publication Data
US 2011/0062863 A1    Mar. 17, 2011

(30) Foreign Application Priority Data
Sep. 17, 2009   (TW) .............................. 98131420 A (51) Int. Cl.
*H01J 1/46*    (2006.01)
(52) U.S. Cl.
USPC ........................... 313/505; 313/504; 313/506
(58) Field of Classification Search
USPC ................ 313/495–512; 445/24–25
See application file for complete search history.

(56) References Cited

U.S. PATENT DOCUMENTS

| | | | | |
|---|---|---|---|---|
| 2006/0226422 A1* | 10/2006 | Millard et al. | | 257/40 |
| 2006/0262242 A1* | 11/2006 | Koma | | 349/69 |
| 2008/0012476 A1* | 1/2008 | Kim et al. | | 313/504 |
| 2008/0074041 A1* | 3/2008 | Nakayama | | 313/504 |
| 2008/0309850 A1 | 12/2008 | Tanase et al. | | |

FOREIGN PATENT DOCUMENTS

| CN | 1873499 A | 12/2006 |
|---|---|---|
| CN | 1937874 A | 3/2007 |
| CN | 101009302 A | 8/2007 |
| CN | 201335925 Y | 10/2009 |

OTHER PUBLICATIONS

China Official Action Issued on Mar. 22, 2012.
Taiwan Official Action issued on Mar. 27, 2013.

* cited by examiner

*Primary Examiner* — Anh Mai
*Assistant Examiner* — Elmito Breval
(74) *Attorney, Agent, or Firm* — Chun-Ming Shih (57) ABSTRACT

A front light plate includes a transparent substrate, a first electrode layer disposed on the transparent substrate and including first electrodes arranged in parallel, a second electrode layer disposed opposite to the first electrode layer and including second electrodes arranged in parallel, and light emitting components. The light emitting components arranged in array are disposed between the first electrode layer and the second electrode layer and at overlapping positions of the first electrodes and the second electrodes. Each of the light emitting components has a top surface connected to the corresponding first electrode, a bottom surface connected to the corresponding second electrode and a side surface between the top surface and the bottom surface. The side surface is a light emitting surface. The front light plate has high brightness uniformity and high light utility efficiency.

19 Claims, 6 Drawing Sheets

FRONT LIGHT PLATE AND REFLECTIVE DISPLAY APPARATUS USING THE SAME

CROSS-REFERENCE TO RELATED APPLICATIONS

This application is based upon and claims the benefit of priority from the prior Taiwanese Patent Application No. 098131420, filed Sep. 17, 2009, the entire contents of which are incorporated herein by reference.

BACKGROUND

1. Field of the Invention

The present invention relates to a plane light source device, and particularly to a front light plate.

2. Description of the Related Art

With the advancement of the flat display technology and due to the flat display apparatuses having advantages of light in weight, small in size and low power consuming, the flat display apparatuses have become more and more popular. In general, the flat display apparatuses include liquid crystal display (LCD) apparatuses, plasma display panel (PDP) apparatuses, organic light emitting diode (OLED) display apparatuses and electrophoretic display (EPD) apparatuses, etc., wherein the LCD apparatuses are more popular than others.

In general, the common LCD apparatus is a transmission LCD apparatus. The transmission LCD apparatus using a backlight module to provide a plane light source to an LCD panel, the LCD panel converts the plane light source into a color image. However, an user can not clearly see the color image displayed by the transmission LCD apparatus when environment brightness is greater than brightness of the plane light source. Therefore, it is inconvenient for the user to use the transmission LCD apparatus in outdoor during daytime. Moreover, power wastage of the backlight module is nearly 90% of that of the transmission LCD apparatus. However, the back light module operates no matter the transmission LCD apparatus is used in outdoor or indoor. Therefore, the transmission LCD apparatus can not achieve power saving and environmental protection.

Comparing to a transmission display apparatus such as the transmission LCD apparatus, a reflective display apparatus relies on environment light to display. Because the backlight light module is not used in the reflective display apparatus, the reflective display apparatus can achieve power saving and environmental protection. Among various reflective display apparatuses, the electronic paper display apparatus is valued due to its advantages of power saving, thin thickness and flexibility.

However, the reflective display apparatus can not be used when the environment light is not bright enough. To solve the disadvantage, a reflective display apparatus having light emitting components is provided in prior art. The light emitting components of the reflective display apparatus can emit light when the environment light is not bright enough. The light emitting components are light emitting diodes (LEDs) or organic light emitting diodes (OLEDs) and are disposed to surround a display area of the reflective display apparatus.

Although the light emitting components enables the reflective display apparatus can be used when the environment light is not bright enough, the lights provided by the light emitting components can not be uniformly distributed in the display area. Therefore, brightness uniformity of the image displayed by the reflective display apparatus is bad.

BRIEF SUMMARY

The present invention provides a front light plate having high brightness uniformity and high light utility efficiency.

The present invention further provides a front light plate having high brightness uniformity and high light utility efficiency.

To achieve the above-mentioned advantages, the present invention provides a front light plate including a transparent substrate, a first electrode layer, a second electrode layer, and a plurality of light emitting components. The first electrode layer is disposed on the transparent substrate and includes a plurality of first electrodes arranged in parallel, wherein the first electrodes are stripe electrodes. The second electrode layer is disposed opposite to the first electrode layer and includes a plurality of second electrodes arranged in parallel, wherein the second electrodes are stripe electrodes. An arranging direction of the first electrodes is perpendicular to an arranging direction of the second electrodes. The light emitting components are disposed between the first electrode layer and the second electrode layer. The light emitting components are located at overlapping positions of the first electrodes and the second electrodes and are arranged in array. Each of the light emitting components has a top surface, a bottom surface and a side surface connected between the top surface and the bottom surface. The top surface is electrically connected to the corresponding first electrode, the bottom surface is electrically connected to the corresponding second electrode, and the side surface is a light emitting surface.

In one embodiment of the present invention, each of the first electrodes has a plurality of first protrusion portions. Each of the second electrodes has a plurality of second protrusion portions opposite to the first protrusion portions. The top surface and the bottom surface of each of the light emitting components are electrically connected to the corresponding first protrusion portion and the corresponding second protrusion portion respectively.

In one embodiment of the present invention, an area of the top surface is greater than an area of the bottom surface and the side surface is reduced from the top surface toward the bottom surface.

In one embodiment of the present invention, an area of the top surface is greater than an area of the bottom surface and the side surface is a curved surface concaved toward an internal of the light emitting component.

In one embodiment of the present invention, the light emitting components are OLEDs or LEDs.

In one embodiment of the present invention, the first electrodes and the second electrodes are metal electrodes or transparent electrodes.

In one embodiment of the present invention, the transparent substrate is a glass substrate.

To achieve the above-mentioned advantages, the present invention further provides a front light plate including a transparent substrate, a first electrode layer, a second electrode layer, a plurality of first light emitting components and a plurality of second light emitting components. The first electrode layer is disposed on the transparent substrate and includes a plurality of first electrodes, a plurality of bumps and a plurality of second electrodes. The first electrodes are arranged in parallel on the transparent substrate and the first electrodes are stripe electrodes. The bumps are disposed on each of the first electrodes, and each of the first electrodes has a number of the bumps disposed thereon. Each of the bumps has a top surface, a bottom surface and a side surface connected between the top surface and the bottom surface. The top surface is connected to the corresponding first electrode. Moreover, each of the second electrodes covers the bottom surface and the side surface of the corresponding bump and electrically connected to the corresponding first electrode. The second electrode layer is disposed opposite to the first electrode layer and includes a plurality of transparent electrodes arranged in parallel. The transparent electrodes are stripe electrodes. An arranging direction of the transparent electrodes is perpendicular to an arranging direction of the first electrodes. The bumps are located at overlapping positions of the first electrodes and the transparent electrodes and are arranged in array. Each of the transparent electrodes includes a first sub-electrode and a second sub-electrode arranged in parallel. The first sub-electrode and the second sub-electrode are disposed at two opposite sides of the corresponding bumps and opposite to the side surfaces of the corresponding bumps. Furthermore, the first light emitting components are respectively disposed between each corresponding first sub-electrode and second electrode. A first light emitting surface of each of the first light emitting components is connected to the corresponding first sub-electrode. The second light emitting components are respectively disposed between each corresponding second sub-electrode and second electrode. A second light emitting surface of each of the second light emitting components is connected to the corresponding second sub-electrode.

In one embodiment of the present invention, the bumps and the second electrodes have same material.

In one embodiment of the present invention, material of the bumps includes insulation material.

In one embodiment of the present invention, material of the bumps includes photoresist.

In one embodiment of the present invention, an area of the top surface is greater than an area of the bottom surface and the side surface is reduced from the top surface to the bottom surface.

In one embodiment of the present invention, the first light emitting components and the second light emitting components are OLEDs or LEDs.

In one embodiment of the present invention, the first electrodes are transparent electrodes.

In one embodiment of the present invention, the second electrodes are transparent electrodes.

In one embodiment of the present invention, the second electrodes are non-transparent electrodes.

In one embodiment of the present invention, the transparent substrate is a glass substrate.

In the front light plate of the present invention, the light emitting components are arranged in array and the side surface of each of the light emitting components is the light emitting surface, so the light emitted by the light emitting components can be uniformly distributed, and the brightness uniformity and the light utility efficiency of the front light plate are consequently improved. Moreover, in another front light plate of the present invention, the first light emitting components and the second light emitting components are respectively disposed at two opposite sides of the bumps disposed on the first electrodes, so directions faced by the light emitting surfaces of the first light emitting components and the second light emitting components are substantially identical to directions faced by the side surfaces of the bumps. Such that, the light provided by the first light emitting components and the second light emitting components can be uniformly distributed to let the front light plate has higher brightness uniformity and higher light utility efficiency.

The front light plates of the present invention are adapted to be applied to the reflective display apparatuses to enables the reflective display apparatuses to be used while the environment light is not bright enough. Furthermore, the brightness uniformity of the front light plates of the present invention is higher, so display quality of the reflective display apparatuses can be improved.

BRIEF DESCRIPTION OF THE DRAWINGS

These and other features and advantages of the various embodiments disclosed herein will be better understood with respect to the following description and drawings, in which like numbers refer to like parts throughout, and in which.

DETAILED DESCRIPTION

Figure 1:
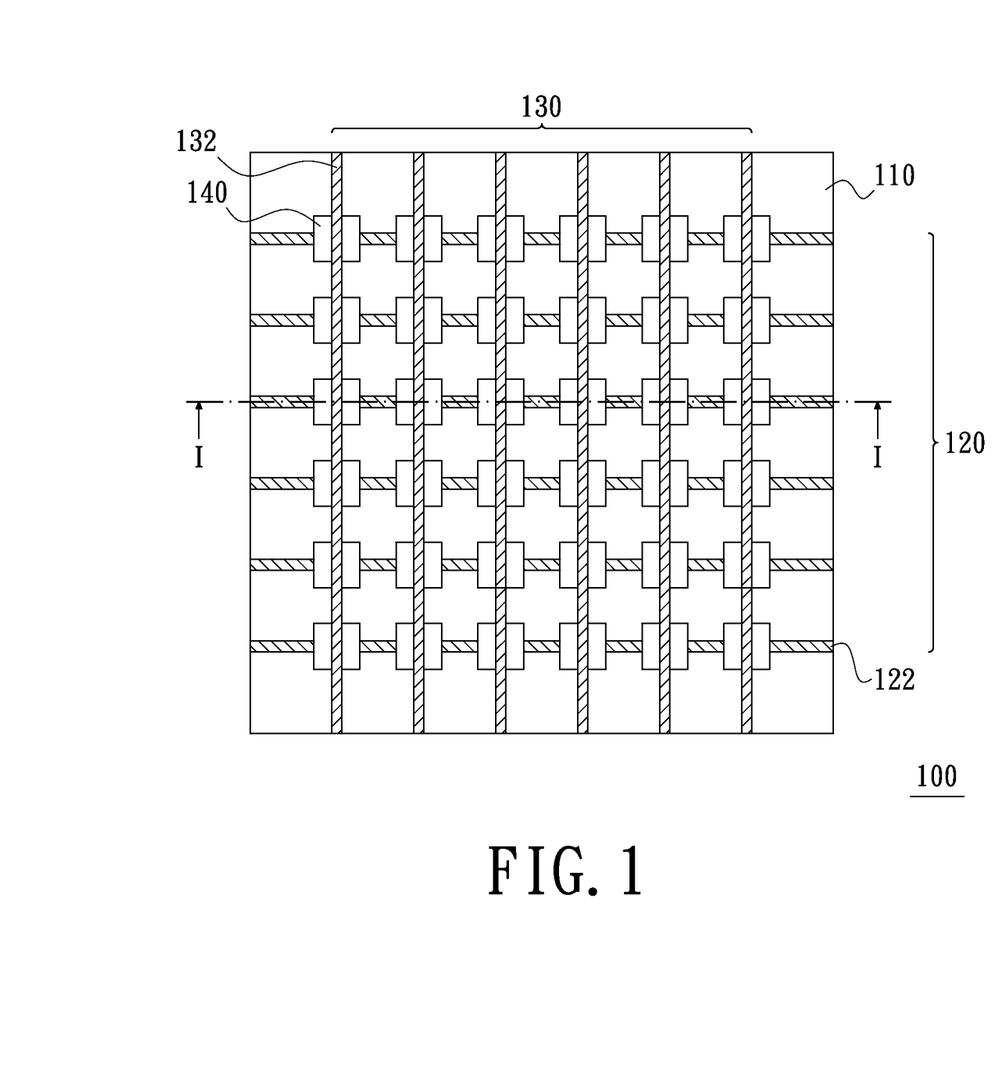
FIG. 1 is a schematic top-view of a front light plate according to a first embodiment of the present invention.
Figure 2:
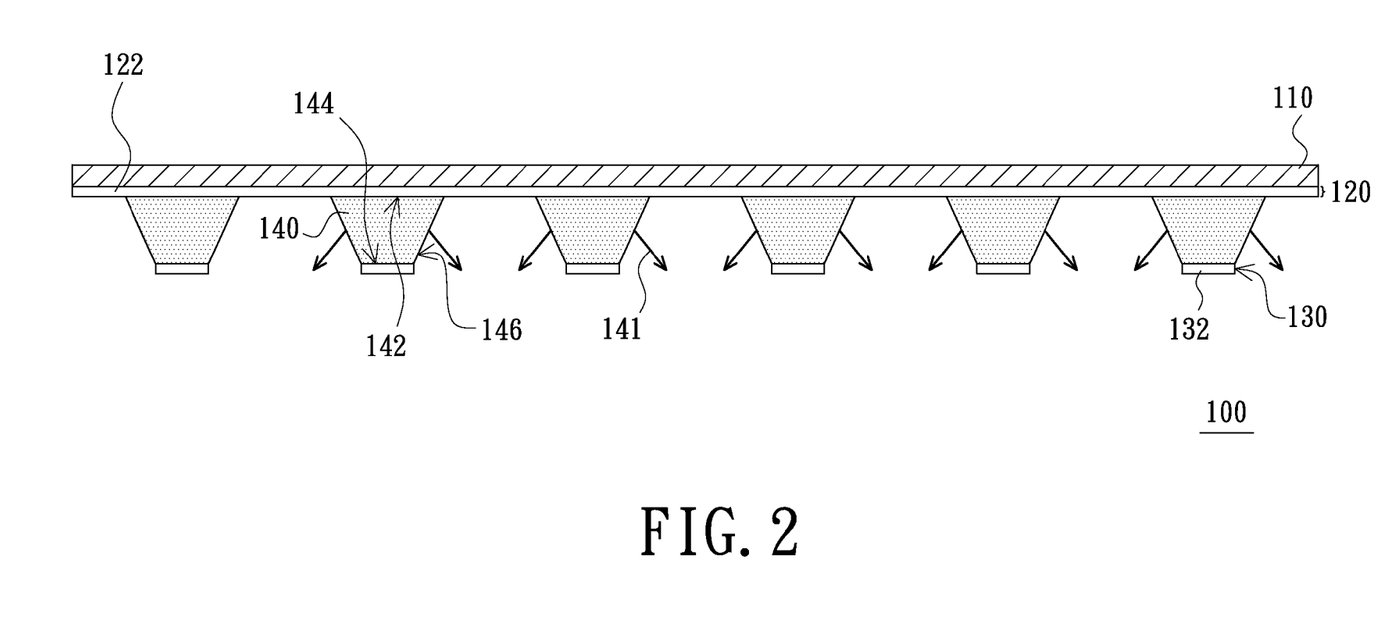
FIG. 2 is a schematic cross-section view along line I-I in FIG. 1.

FIG. 1 is a schematic top-view of a front light plate according to a first embodiment of the present invention, and FIG. 2 is a schematic cross-section view along line I-I in FIG. 1. Referring to FIGS. 1 and 2, the front light plate 100 of the first embodiment includes a transparent substrate 110, a first electrode layer 120, a second electrode layer 130 and a plurality of light emitting components 140. The first electrode layer 120 is disposed on the transparent substrate 110, and the light emitting components 140 are disposed between the first electrode layer 120 and the second electrode layer 130.

In the front light plate 100, the transparent substrate 110 can be a glass substrate, a plastic substrate or other transparent substrate.

The first electrode layer 120 includes a plurality of first electrodes 122 arranged in parallel and the first electrodes 122 are stripe electrodes. In the first embodiment, intervals between each two adjacent first electrodes 122 are, for example, the same. The first electrodes 122 can be transparent electrodes or metal electrodes. Material of the transparent electrodes can be, but not limited to, indium tin oxides (ITO), indium zinc oxide (IZO), zinc oxide (ZnO) or indium gallium zinc oxide (IGZO). Material of the metal electrodes can be, but not limited to, aluminum or copper.

The second electrode layer 130 is opposite to the first electrode layer 120 and includes a plurality of second electrodes 132 arranged in parallel, wherein the second electrodes 132 are stripe electrodes. In the first embodiment, intervals between each two adjacent second electrodes 132 are, for example, the same, and an arranging direction of the first electrodes 122 are, for example, perpendicular to an arranging direction of the second electrodes 132. Similarly, the second electrodes 132 can be transparent electrodes or metal electrodes. Material of the transparent electrodes can be, but not limited to, ITO, IZO, ZnO or IGZO. Material of the metal electrodes can be, but not limited to, aluminum or copper.

The light emitting components 140 are disposed between the first electrode layer 120 and the second electrode layer 130. The light emitting components 140 are located at overlapping positions of the first electrodes 122 and the second electrodes 132 and are arranged in array. More specifically, each of the light emitting components 140 has a top surface 142, a bottom surface 144 and a side surface 146 connected between the top surface 142 and the bottom surface 144. The top surface 142 of each of the light emitting components 140 is electrically connected to the corresponding first electrode 122, and the bottom surface 144 of each of the light emitting components 140 is electrically connected to the corresponding second electrode 132. The first electrodes 122 and the second electrodes 132 are adapted to transmit driving voltage to the corresponding light emitting components 140. The side surface 146 of each of the light emitting components 140 is a light emitting surface.

In the first embodiment, the light emitting components 140 can be OLEDs, LEDs or other suitable point light sources. Moreover, in one embodiment that the first electrodes 122 and the second electrodes 132 are transparent electrodes. Moreover, an area of the top surface 142 of each of the light emitting components 140 is greater than an area of the bottom surface 144, and the side surface 146 is reduced from the top surface 142 toward the bottom surface 144. Such that, the light emitting surface (i.e. the side surface 146) of each of the light emitting components 140 substantially faces the second electrodes 132 connected by adjacent two light emitting components 140 rather than right below, so the lights 141 provides by each of the light emitting components 140 can be uniformly distributed so as to prevent dark areas from existing between the light emitting components 140. Therefore, the front light plate 100 of the first embodiment can provide a plane light source having better brightness uniformity.

Furthermore, due to the light emitting components 140 having side emitting structures, transmission paths of the lights 141 inside the light emitting components 140 can be efficiently reduced so as to reduce light loss. Therefore, the front light plate 100 of the first embodiment has better light utility efficiency. Moreover, due to the light emitting components 140 having the side emitting structures, refractive angles of the lights 141 emitting from the light emitting surfaces (i.e. the side surface 146) are greater. Even if a number the light emitting components 140 in per unit area is suitably reduced, the front light plate 100 still can provide the plane light source having better brightness uniformity. Therefore, the number of the light emitting components 140 of the front light plate 100 can be suitably reduced to reduce cost and achieve power saving.

Figure 3:
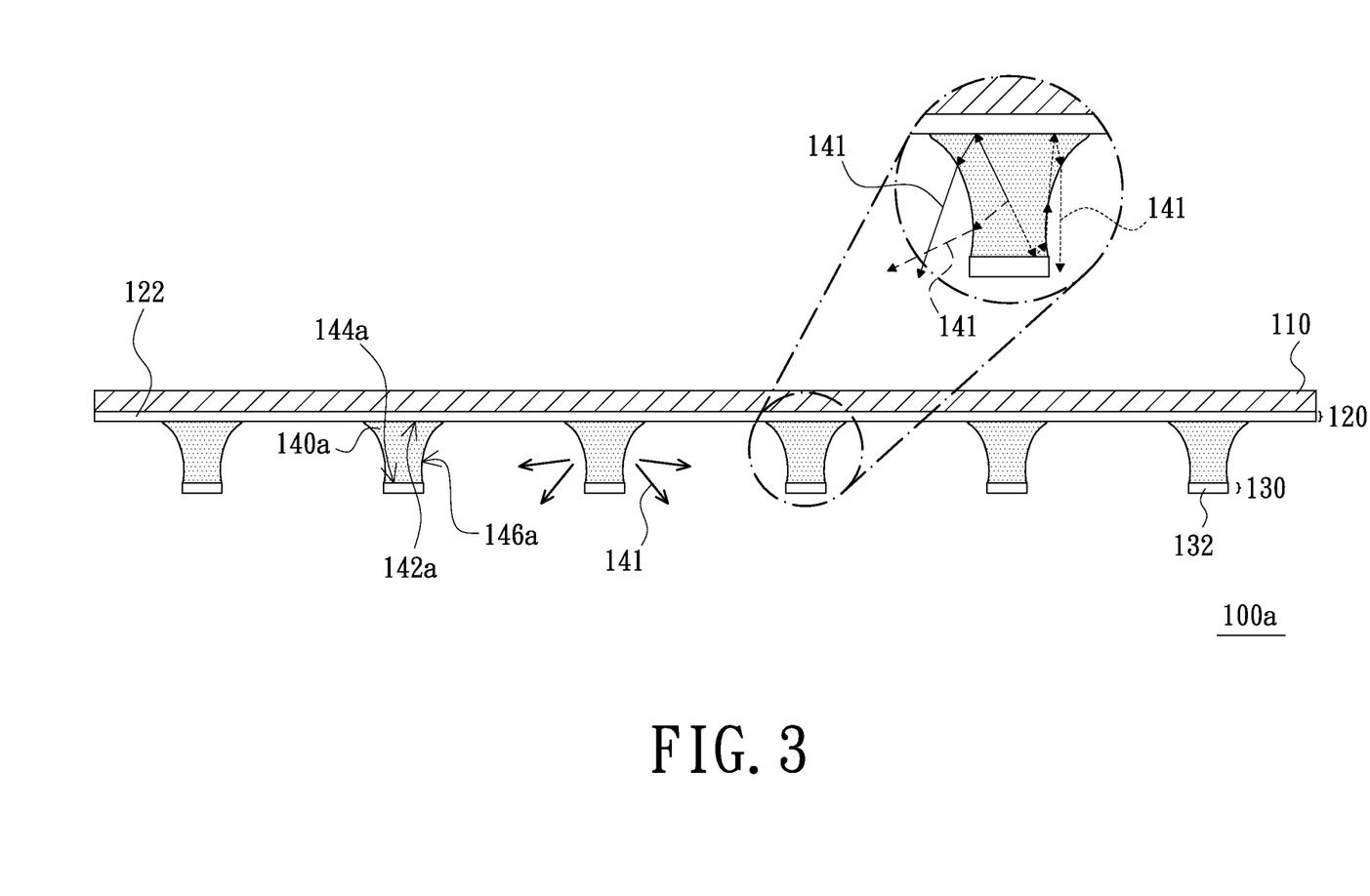
FIG. 3 is a schematic cross-section view of a front light plate according to a second embodiment of the present invention.

FIG. 3 is a schematic cross-section view of a front light plate according to a second embodiment of the present invention. Referring to FIG. 3, the front light plate 100a of the second embodiment is similar to the front light plate 100 of the first embodiment, and the difference is the structures of the light emitting components. In the second embodiment, the area of the top surface 142a of each of the light emitting components 140a is greater than the area of the bottom surface 144a, and the side surface 146a of each of the light emitting components 140a is a curved surface concaved toward an internal of the light emitting components 140a. Comparing to the light emitting components 140, light emitting directions of the lights 141 are more uniform due to the side surfaces 146a of the light emitting components 140a being concaved curved surfaces, and therefore the light utility efficiency is further improved.

Figure 4:
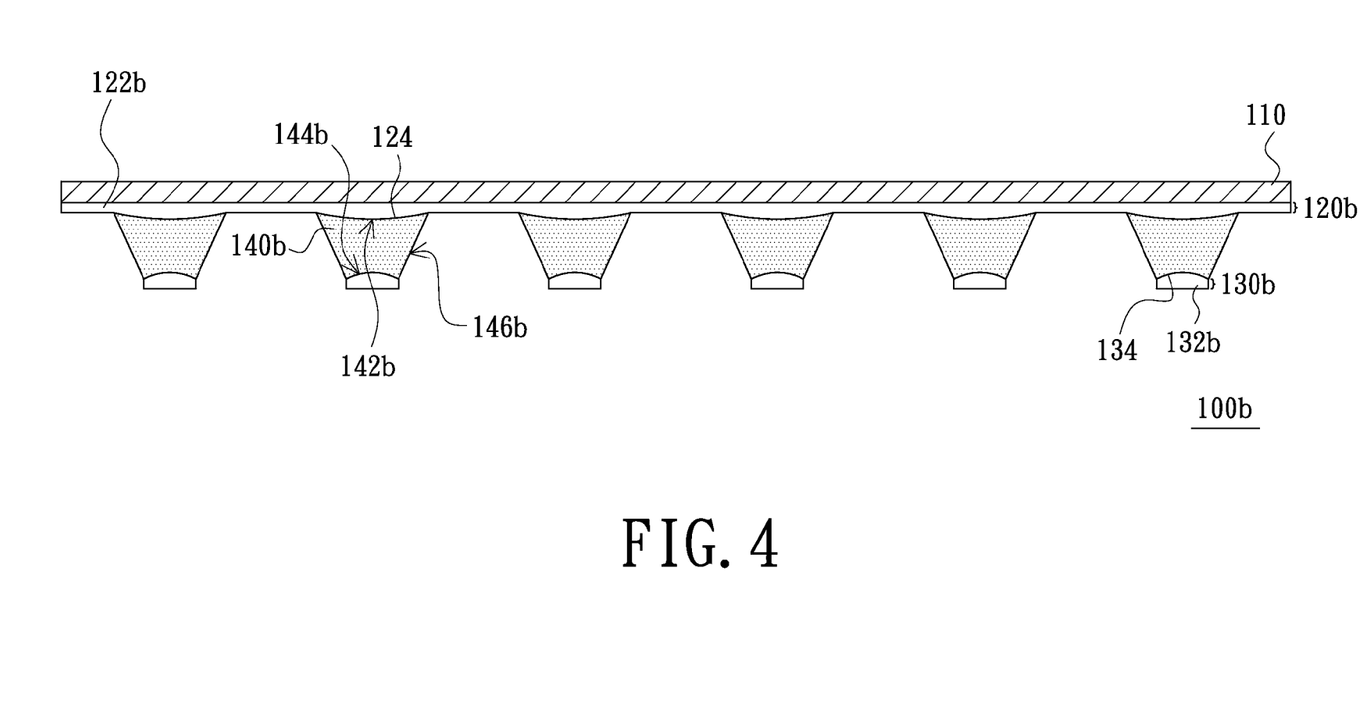
FIG. 4 is a schematic cross-section view of a front light plate according to a third embodiment of the present invention.

FIG. 4 is a schematic cross-section view of a front light plate according to a third embodiment of the present invention. Referring to FIG. 4, the difference between the front light plate 100b of the third embodiment and the front light plate 100 of the first embodiment is that each of the first electrodes 122b of the first electrode layer 120b of the front light plate 100b has a plurality of first protrusion portions 124 and each of the second electrodes 132b of the second electrode layer 130b of the front light plate 100b has a plurality of second protrusion portions 134 opposite to the first protrusion portions 124. The first protrusion portions 124 are respectively corresponded to the second protrusion portions 134 and located at overlapping portions of the first electrodes 122 and the second electrodes 132. The top surface 142b of each of the light emitting components 140b is a curved surface connected to the corresponding first protrusion portions 132. The bottom surface 144b of each of the light emitting components 140b is a curved surface connected to the corresponding second protrusion portions 134. The top surface 142b and the bottom surface 144b of each of the light emitting components 140b are electrically connected to the corresponding first protrusion portion 132 and the corresponding second protrusion portion 134 respectively. In the third embodiment, the area of the top surface 142b of each of the light emitting components 140b is greater than the area of the bottom surface 144b, and the side surface 146b is reduced from the top surface 142b to the bottom surface 144. It should be understood that the side surface 146b of the light emitting component 140b also can be a curved surface concaved toward the light emitting component 140b.

In the present embodiment, the first protrusion portions 124 and the second protrusion portions 134 can disperse the lights in the light emitting components 140b to prevent the lights from converging in the light emitting components 140b, and this can further improve the light utility efficiency of the front light plate 100b.

Figure 5:
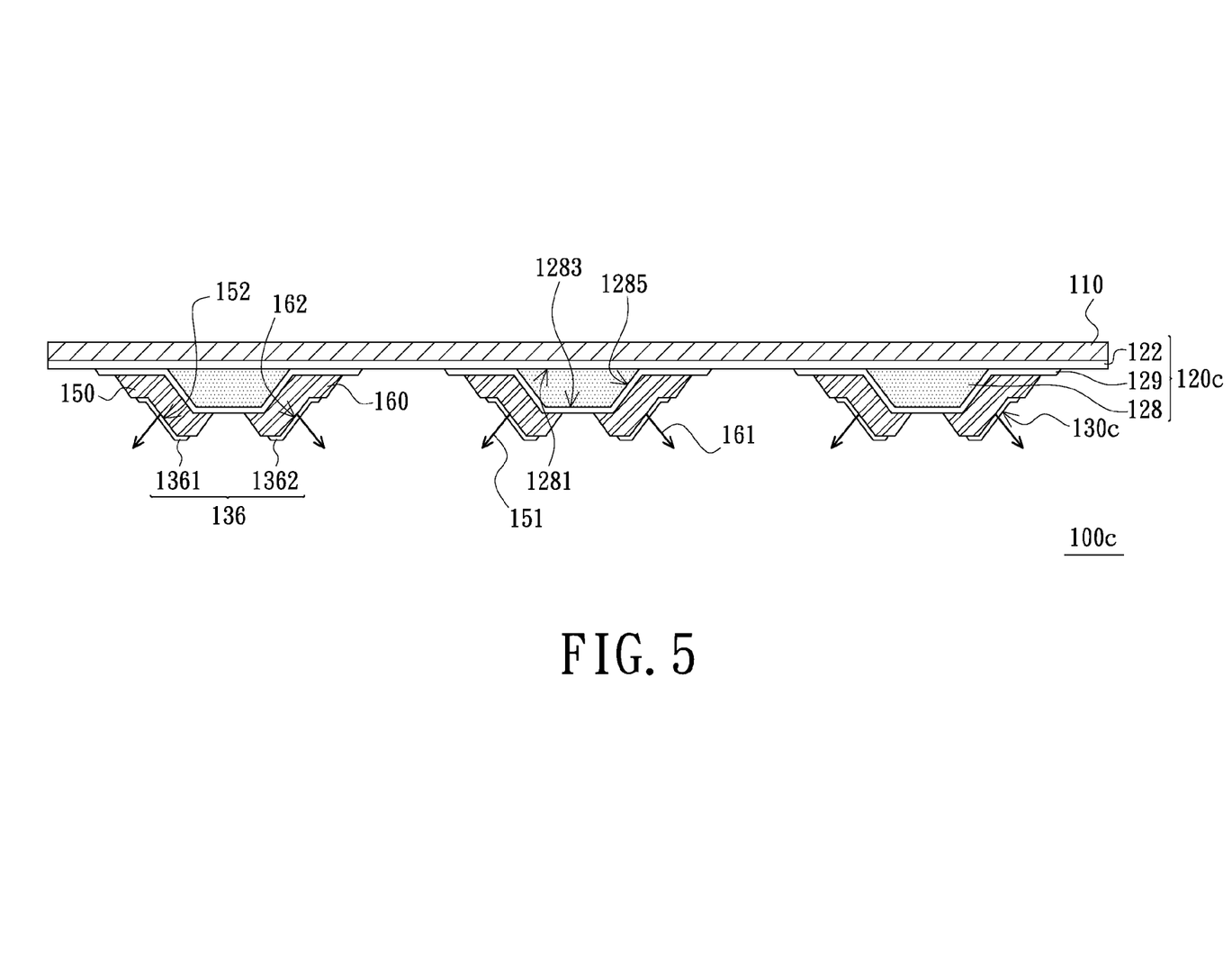
FIG. 5 is a schematic cross-section view of a front light plate according to a forth embodiment of the present invention.

FIG. 5 is a schematic cross-section view of a front light plate according to a forth embodiment of the present invention. Referring to FIG. 5, the front light plate 100c of the forth embodiment includes a transparent substrate 110, a first electrode layer 120c, a second electrode layer 130c, a plurality of first light emitting components 150 and a plurality of second light emitting components 160. The first electrode layer 120c is disposed on the transparent substrate 110, and the first light emitting components 150 and the second light emitting components 160 are disposed between the first electrode layer 120c and the second electrode layer 130c.

The first electrode layer 120c includes a plurality of first electrodes 122 (only one shown in FIG. 5), a plurality of bumps 128 and a plurality of second electrodes 129. The first electrodes are stripe electrodes and are arranged in parallel on the transparent substrate 110. In the present embodiment, intervals between each two adjacent first electrodes 122 are, for example, the same. The first electrodes 122 can be transparent electrodes, wherein material of the transparent electrodes can be, but not limited to, ITO, IZO, ZnO or IGZO.

The bumps 128 of the first electrode layer 120c are disposed on each of the first electrodes 122, and each of the first electrodes 122 has a number of the bumps 128 disposed thereon. Moreover, each of the bumps 128 has a top surface 1281, a bottom surface 1283 and a side surface 1285 connected between the top surface 1281 and the bottom surface 1283. The area of the top surface 1281 of each of the bumps 128 is greater than the area of the bottom surface 1283, and the side surface 1285 is, for example, reduced from the top surface 1281 toward the bottom surface 1283. The top surface 1281 of each of the bumps 128 is connected to the corresponding first electrode 122. The second electrodes 129 of the first electrode layer 120c are corresponded to the bumps 128, and each of the second electrodes 129 covers the bottom surface 1283 and the side surface 1285 of the corresponding bump 128 and is electrically connected to the corresponding first electrode 122.

The second electrodes 129 can be transparent electrodes or non-transparent electrodes. Material of the transparent electrodes can be, but not limited to ITO, IZO, ZnO or IGZO. The non-transparent electrodes can be metal electrodes. Material of the metal electrodes can be, but not limited to, aluminum or copper. Material of the bumps 128 can be insulation material such as photoresist. In another embodiment, the material of the bumps 128 and the material of the second electrodes 129 can be the same.

The second electrode layer 130c is disposed opposite to the first electrode layer 120c. The second electrode layer 130c includes a plurality of transparent electrodes 136, wherein the transparent electrodes 136 are stripe electrodes. In the present embodiment, intervals between each two adjacent transparent electrodes are, for example, the same. An arranging direction of the transparent electrodes 136 is, for example, perpendicular to an arranging direction of the first electrodes 122. The bumps 128 of the first electrode layer 120c are disposed at overlapping portions of the first electrodes 122 and the transparent electrodes 136 and are arranged in array.

In the present embodiment, each of the transparent electrodes 136 includes a first sub-electrode 1361 and a second sub-electrode 1362 arranged in parallel. The first sub-electrode 1361 and the second sub-electrode 1362 of the transparent electrode 136 correspond to the bumps 128 arranged along an extending direction of the transparent electrode 136, wherein the first sub-electrode 1361 and the second sub-electrode 1362 are located at two opposite sides of the corresponding bumps 128 and are opposite to the side surfaces 1285 of the corresponding bumps 128. In other words, the first sub-electrode 1361 and the second sub-electrode 1362 are opposite to the second electrodes 129 disposed on the corresponding bumps 128. Material of the transparent electrodes 136 (i.e. the first sub-electrodes 1361 and the second sub-electrodes 1362) can be, but not limited to, ITO, IZO, ZnO or IGZO.

The first light emitting components 150 and the second light emitting components 160 can be OLEDs, LEDs or other suitable point light sources. Moreover, the first light emitting components 150 and the second light emitting components 160 are disposed between the first electrode layer 120c and the second electrode layer 130c. The first light emitting components 150 and the second light emitting components 160 are located at overlapping positions of the first electrodes 122 and the transparent electrodes 136 and are arranged in array. Each pair of the first light emitting component 150 and the second light emitting component 160 is corresponded to one of the second electrodes 129 disposed on the bump 128.

More specifically, each of the first light emitting components 150 is disposed between the corresponding first sub-electrode 1361 and the corresponding second electrode 129, and a first light emitting surface 152 of each of the first light emitting components 150 is connected to the corresponding first sub-electrode 1361. Such that, the lights provided by the first light emitting components 150 can emit from the first light emitting surface 152 and then pass through the first sub-electrode 1361. Moreover, each of the second light emitting components 160 is disposed between the corresponding second sub-electrode 1362 and the corresponding second electrode 129, and a second light emitting surface 162 of each of the second light emitting components 160 is connected to the corresponding second sub-electrode 1362. Such that, the lights provided by the second light emitting components 160 can emit from the second light emitting surface 162 and then pass through the second sub-electrode 1362.

Due to the first light emitting components 150 and the second light emitting components 160 being disposed on the bumps 128, directions faced by the first light emitting surfaces 152 and the second light emitting surfaces 162 of the first light emitting components 150 and the second light emitting components 160 are substantially identical to directions faced by the side surfaces 1285 of the bumps 128. Such that, the lights 151 and 161 provided by the first light emitting components 150 and the second light emitting components 160 can be uniformly distributed to enable the front light plate 100c to provide a plane light source having better brightness uniformity.

Figure 6:
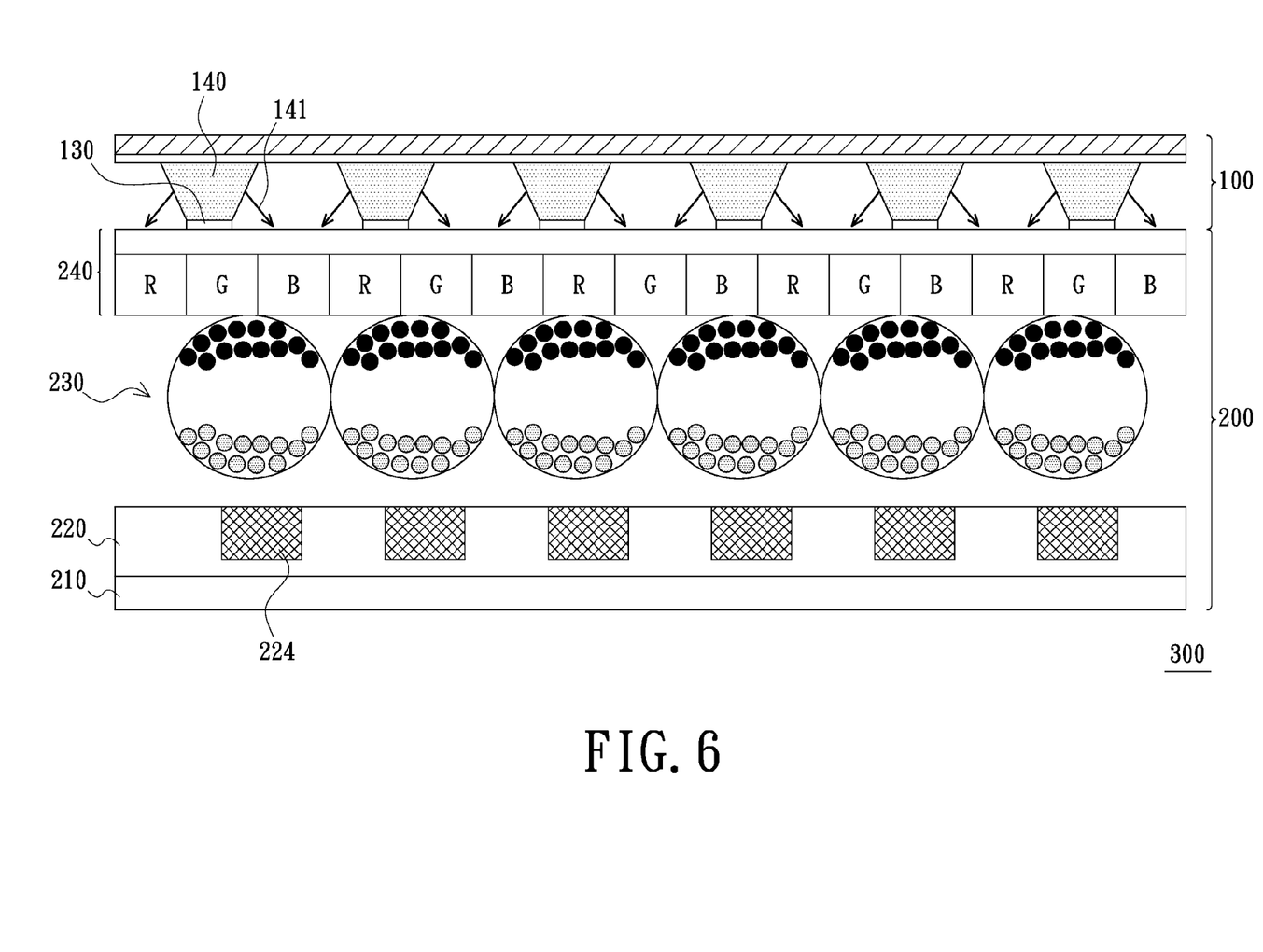
FIG. 6 is a schematic view of a reflective electrophoretic display apparatus according to one embodiment of the present invention.

FIG. 6 is a schematic view of a reflective electrophoretic display apparatus according to one embodiment of the present invention. Referring to FIG. 6, the reflective electrophoretic display apparatus 300 of the present embodiment includes the front light plate 100 and an electrophoretic display panel 200, wherein the front light plate 100 is disposed on the electrophoretic display panel 200 for providing the plane light source to the electrophoretic display panel 200.

More specifically, the electrophoretic display panel 200 includes a substrate 210, a driving circuit layer 220, an electrophoretic layer 230 and a color filter substrate 240. The driving circuit layer 220 is formed on the substrate 210, the electrophoretic layer 230 is disposed on the driving circuit layer 220, and the color filter substrate 240 is disposed on the electrophoretic layer 230. The driving circuit layer 220 includes a plurality of thin film transistors (TFTs) 224 arranged in array. The color filter substrate 240 includes a plurality of color photoresists such as red photoresists R, green photoresists G and blue photoresists B. The second electrode layer 130 of the front light plate 100 is adjacent to the color filter substrate 240. When the reflective electrophoretic display apparatus 300 is used in dark environment, the front light plate 100 can provide the plane light source to the electrophoretic display panel 200. Such that, even if the reflective electrophoretic display apparatus 300 is used in dark environment, the user still can see an image displayed by the electrophoretic display panel 200.

In the present embodiment, the positions of the light emitting components 140 of the front light plate 100 can be corresponded to the TFTs 224 of the driving circuit layer 220 so as to reduce probability of current leakage of the TFTs 224. Moreover, the front light plate 100 can provide the plane light source having better brightness uniformity even if the number of the light emitting components 140 of the front light plate 100 is suitably reduced, so an aperture ratio of the reflective electrophoretic display apparatus 300 can be increased.

It should be noted that the front light plates 100a, 100b or 100c disclosed by other embodiments also can be applied to the reflective electrophoretic display apparatus 300. Moreover, the front light plate 100, 100a, 100b or 100c of the embodiments of the present invention also can be applied to other type of reflective display apparatus.

In summary, the present invention has at least the following advantages:

1. In one embodiment, the lights provided by the light emitting components can be uniformly distributed due to the light emitting components of the front light plate being arranged in array and the light emitting surface of each of the light emitting component substantially facing the second electrodes connected by the adjacent two light emitting components. Therefore, the front light plate can provide the plane light source having better brightness uniformity.

2. In another embodiment, the lights provided by the first light emitting components and the second light emitting components can be uniformly distributed due to the first light emitting components and the second light emitting components being disposed on the bumps. Therefore, the front light plate can provide the plane light source having better brightness uniformity.

3. The number of the light emitting components can be suitably reduced because the refractive angles of the lights emitting from the light emitting surfaces are greater. Therefore, the plane light source has advantages of low cost and power saving.

4. The front light plate can increase the aperture ratio of the reflective electrophoretic display apparatus because the number of the light emitting components can be suitably reduced in the present invention.

The above description is given by way of example, and not limitation. Given the above disclosure, one skilled in the art could devise variations that are within the scope and spirit of the invention disclosed herein, including configurations ways of the recessed portions and materials and/or designs of the attaching structures. Further, the various features of the embodiments disclosed herein can be used alone, or in varying combinations with each other and are not intended to be limited to the specific combination described herein. Thus, the scope of the claims is not to be limited by the illustrated embodiments.

What is claimed is:

1. A front light plate comprising:
   a transparent substrate;
   a first electrode layer disposed on the transparent substrate, the first electrode layer comprising a plurality of first electrodes arranged in parallel, and the first electrodes being stripe electrodes;
   a second electrode layer disposed opposite to the first electrode layer, the second electrode layer comprising a plurality of second electrodes arranged in parallel, the second electrodes being stripe electrodes, and an arranging direction of the first electrodes being perpendicular to an arranging direction of the second electrodes; and
   a plurality of light emitting components disposed between the first electrode layer and the second electrode layer, the light emitting components being located at overlapping positions of the first electrodes and the second electrodes and being arranged in array, each of the light emitting components having a top surface, a bottom surface and a side surface connected between the top surface and the bottom surface, the top surface being electrically connected to the corresponding first electrode, the bottom surface being electrically connected to the corresponding second electrode, and the side surface being a light emitting surface,
   wherein the top surface is completely connected to the corresponding first electrode, the top surface is overlapped the bottom surface, an area of the top surface is greater than an area of the bottom surface, the side surface is reduced from the top surface toward the bottom surface, each of the first electrodes has a plurality of first protrusion portions, each of the second electrodes has a plurality of second protrusion portions opposite to the first protrusion portions, the first protrusion portions are protruded toward the second protrusion portions, the second protrusion portions are protruded toward the first protrusion portions, and the top surface and the bottom surface of each of the light emitting components are electrically connected to the corresponding first protrusion portion and the corresponding second protrusion portion, respectively.

2. The front light plate as claimed in claim 1, wherein the side surface is a curved surface concaved toward an internal of the light emitting component.

3. The front light plate as claimed in claim 1, wherein the light emitting components are organic light emitting diodes or light emitting diodes.

4. The front light plate as claimed in claim 1, wherein the first electrodes and the second electrodes are metal electrodes or transparent electrodes.

5. The front light plate as claimed in claim 1, wherein the transparent substrate is a glass substrate.

6. The front light plate as claimed in claim 1, wherein the top surface of each of the light emitting components is a curved surface connected to the corresponding first protrusion portions, the bottom surface of each of the light emitting components is a curved surface connected to the corresponding second protrusion portions.

7. A front light plate adapted to provide a plane light source to a reflective display panel, the front light plate comprising:
   a transparent substrate;
   a first electrode layer disposed on the transparent substrate and the first electrode layer comprising:
      a plurality of first electrodes arranged in parallel on the transparent substrate and the first electrodes being stripe electrodes;
      a plurality of bumps disposed on each of the first electrodes, each of the first electrodes having a number of the bumps disposed thereon, each of the bumps having a top surface, a bottom surface and a side surface connected between the top surface and the bottom surface, and the top surface being connected to the corresponding first electrode; and
      a plurality of second electrodes, wherein each of the second electrodes covers the bottom surface and the side surface of the corresponding bump and electrically connected to the corresponding first electrode;
   a second electrode layer disposed opposite to the first electrode layer, the second electrode layer comprising a plurality of transparent electrodes arranged in parallel, the transparent electrodes being stripe electrodes, an arranging direction of the transparent electrodes being perpendicular to an arranging direction of the first electrodes, the bumps being located at overlapping positions of the first electrodes and the transparent electrodes and being arranged in array, each of the transparent electrodes comprising a first sub-electrode and a second sub-electrode arranged in parallel, the first sub-electrode and the second sub-electrode being disposed at two opposite sides of the corresponding bumps and opposite to the side surfaces of the corresponding bumps;
   a plurality of first light emitting components respectively disposed between each corresponding first sub-electrode and second electrode, and a first light emitting surface of each of the first light emitting components being connected to the corresponding first sub-electrode; and
   a plurality of second light emitting components respectively disposed between each corresponding second sub-electrode and second electrode, and a second light emitting surface of each of the second light emitting components being connected to the corresponding second sub-electrode.

8. The front light plate as claimed in claim 7, wherein the bumps and the second electrodes have same material.

9. The front light plate as claimed in claim 7, wherein material of the bumps comprises insulation material.

10. The front light plate as claimed in claim 9, wherein material of the bumps comprises photoresist.

11. The front light plate as claimed in claim 7, wherein an area of the top surface is greater than an area of the bottom surface and the side surface is reduced from the top surface to the bottom surface.

12. The front light plate as claimed in claim 7, wherein the first light emitting components and the second light emitting components are organic light emitting diodes or light emitting diodes.

13. The front light plate as claimed in claim 7, wherein the first electrodes are transparent electrodes.

14. The front light plate as claimed in claim 7, wherein the second electrodes are transparent electrodes.

15. The front light plate as claimed in claim 7, wherein the second electrodes are non-transparent electrodes.

16. The front light plate as claimed in claim 7, wherein the transparent substrate is a glass substrate.

17. The front light plate as claimed in claim 7, wherein each of the second electrodes is physically connected to the corresponding first electrode.

18. A reflective display apparatus, comprising:
a reflective display panel; and
a front light plate adapted to provide a plane light source to the reflective display panel, the front light plate comprising:
   a transparent substrate;
   a first electrode layer disposed on the transparent substrate, the first electrode layer comprising a plurality of first electrodes arranged in parallel, and the first electrodes being stripe electrodes;
   a second electrode layer disposed opposite to the first electrode layer, the second electrode layer comprising a plurality of second electrodes arranged in parallel, the second electrodes being stripe electrodes, and an arranging direction of the first electrodes being perpendicular to an arranging direction of the second electrodes; and
   a plurality of light emitting components disposed between the first electrode layer and the second electrode layer, the light emitting components being located at overlapping positions of the first electrodes and the second electrodes and being arranged in array, each of the light emitting components having a top surface, a bottom surface and a side surface connected between the top surface and the bottom surface, the top surface being electrically connected to the corresponding first electrode, the bottom surface being electrically connected to the corresponding second electrode, and the side surface being a light emitting surface,
   wherein the top surface is completely connected to the corresponding first electrode, the top surface is overlapped the bottom surface, an area of the top surface is greater than an area of the bottom surface, the side surface is reduced from the top surface toward the bottom surface, each of the first electrodes has a plurality of first protrusion portions, each of the second electrodes has a plurality of second protrusion portions opposite to the first protrusion portions, the first protrusion portions are protruded toward the second protrusion portions, the second protrusion portions are protruded toward the first protrusion portions, and the top surface and the bottom surface of each of the light emitting components are electrically connected to the corresponding first protrusion portion and the corresponding second protrusion portion, respectively.

19. A reflective display apparatus, comprising:
a reflective display panel; and
a front light plate adapted to provide a plane light source to the reflective display panel, the front light plate comprising:
   a transparent substrate;
   a first electrode layer disposed on the transparent substrate and the first electrode layer comprising:
      a plurality of first electrodes arranged in parallel on the transparent substrate and the first electrodes being stripe electrodes;
      a plurality of bumps disposed on each of the first electrodes, each of the first electrodes having a number of the bumps disposed thereon, each of the bumps having a top surface, a bottom surface and a side surface connected between the top surface and the bottom surface, and the top surface being connected to the corresponding first electrode; and
      a plurality of second electrodes, wherein each of the second electrodes covers the bottom surface and the side surface of the corresponding bump and electrically connected to the corresponding first electrode;
   a second electrode layer disposed opposite to the first electrode layer, the second electrode layer comprising a plurality of transparent electrodes arranged in parallel, the transparent electrodes being stripe electrodes, an arranging direction of the transparent electrodes being perpendicular to an arranging direction of the first electrodes, the bumps being located at overlapping positions of the first electrodes and the transparent electrodes and being arranged in array, each of the transparent electrodes comprising a first sub-electrode and a second sub-electrode arranged in parallel, the first sub-electrode and the second sub-electrode being disposed at two opposite sides of the corresponding bumps and opposite to the side surfaces of the corresponding bumps;
   a plurality of first light emitting components respectively disposed between each corresponding first sub-electrode and second electrode, and a first light emitting surface of each of the first light emitting components being connected to the corresponding first sub-electrode; and
   a plurality of second light emitting components respectively disposed between each corresponding second sub-electrode and second electrode, and a second light emitting surface of each of the second light emitting components being connected to the corresponding second sub-electrode.

* * * * *